United States Patent

Kirchlechner et al.

Patent Number: 5,953,430
Date of Patent: Sep. 14, 1999

[54] FILTER CIRCUIT AND AUDIO SIGNAL PROCESSOR PROVIDED THEREWITH

[75] Inventors: Peter Kirchlechner, Hohenthann; Jörg Schambacher, Müchen; Jürgen Lübbe, Jacobneuharting, all of Germany

[73] Assignee: STMicroelectronics GmbH, Grasbrunn, Germany

[21] Appl. No.: 08/900,606

[22] Filed: Jul. 25, 1997

[30] Foreign Application Priority Data

Jul. 26, 1996 [DE] Germany .............................. 196 30 406

[51] Int. Cl.[6] .................................. H03G 9/00; H03B 1/00
[52] U.S. Cl. .......................... 381/102; 381/120; 381/121; 327/554; 330/109; 330/260
[58] Field of Search ...................................... 381/101–104, 381/108, 109, 120, 121, 123, 98, 96; 333/28 R, 28 T; 327/554, 552–553, 560, 561, 563; 330/109, 254, 260, 271, 278, 302–304, 108, 100, 270, 290, 291

[56] References Cited

U.S. PATENT DOCUMENTS

| | | | |
|---|---|---|---|
| 4,453,143 | 6/1984 | Bennett | 333/28 R |
| 4,543,534 | 9/1985 | Temes et al. | 330/109 |
| 4,763,088 | 8/1988 | Negahban-Hugh | 330/109 |
| 4,899,069 | 2/1990 | Nicollini | 330/109 |
| 5,091,956 | 2/1992 | Miki | 381/98 |
| 5,197,102 | 3/1993 | Sondermeyer | 330/109 |
| 5,327,095 | 7/1994 | Gross et al. | 330/291 |
| 5,391,999 | 2/1995 | Early et al. | 327/554 |
| 5,648,718 | 7/1997 | Edwards | 330/109 |
| 5,651,073 | 7/1997 | Isu et al. | 381/108 |
| 5,719,526 | 2/1998 | Fink | 381/121 |
| 5,771,297 | 6/1998 | Richardson | 381/108 |
| 5,812,030 | 9/1998 | Inami et al. | 330/282 |

FOREIGN PATENT DOCUMENTS

| | | | |
|---|---|---|---|
| 4-250711 | 9/1992 | Japan | 327/554 |
| 2 138 231 | 10/1984 | United Kingdom . | |
| WO 81/03589 | 12/1981 | WIPO | 327/554 |

Primary Examiner—Forester W. Isen
Assistant Examiner—Xu Mei
Attorney, Agent, or Firm—David V. Carlson; Seed and Berry LLP

[57] ABSTRACT

A filter circuit adjustably decreases or increases the amplitude of audio signals in a predetermined frequency range. The filter circuit includes a filter module having an RC network with at least one frequency-response-determining RC member whose resistor component R is realized in SC technology. A setting device is connected to the filter module such that its setting determines the frequency response of the SC filter. The setting device renders possible a neutral setting in which the effective audio signal path of the filter circuit circumvents the filter module so that no decrease or increase of the amplitude of individual frequency portions takes place. Furthermore, an audio signal processor comprises at least one audio signal input, at least one audio signal output, and at least one control input. The audio signal processor also comprises an audio signal processing unit connected between the audio signal input and the audio signal output, with the audio signal processing unit having at least one such filter circuit.

20 Claims, 9 Drawing Sheets

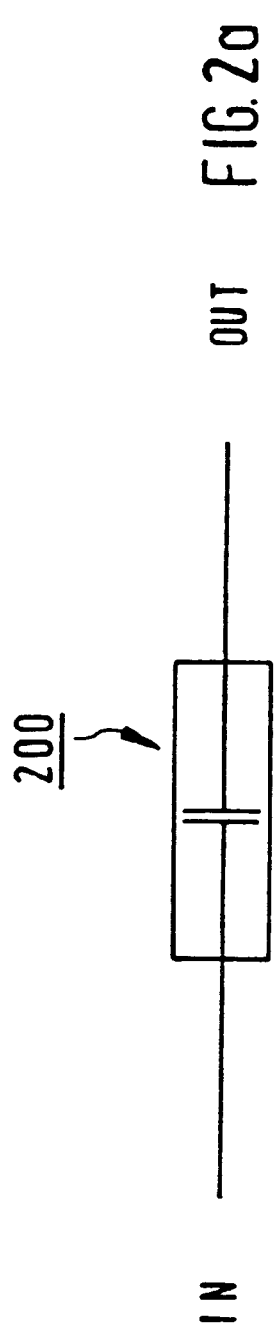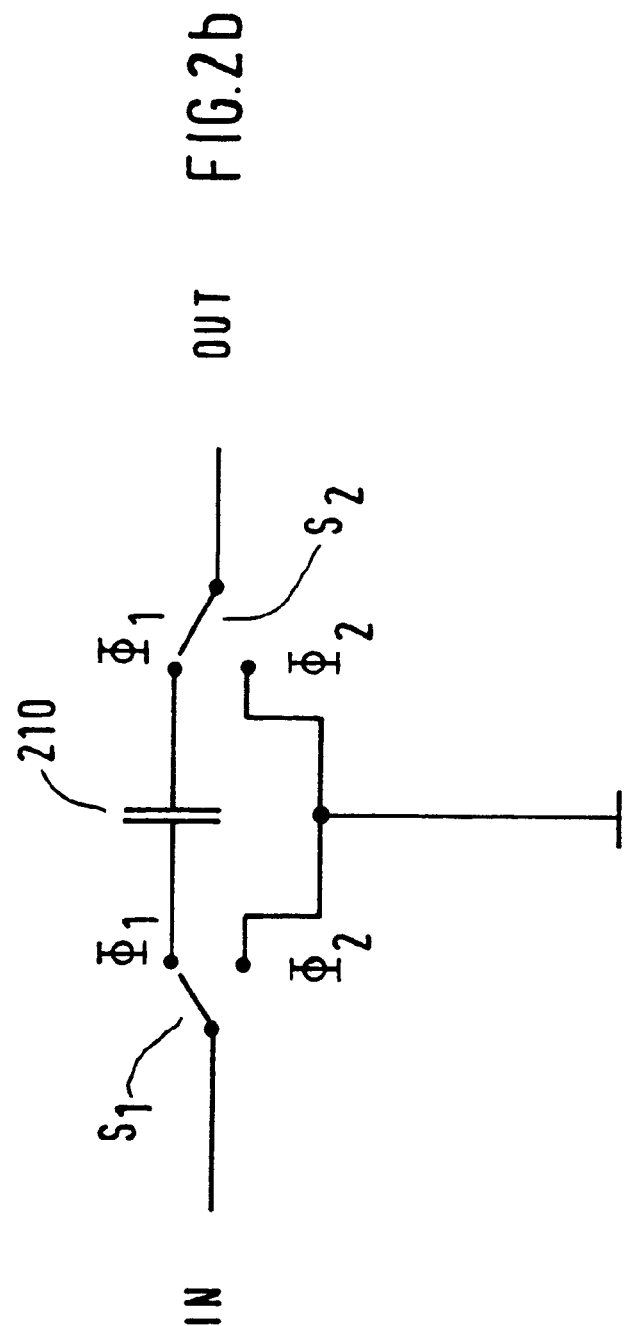

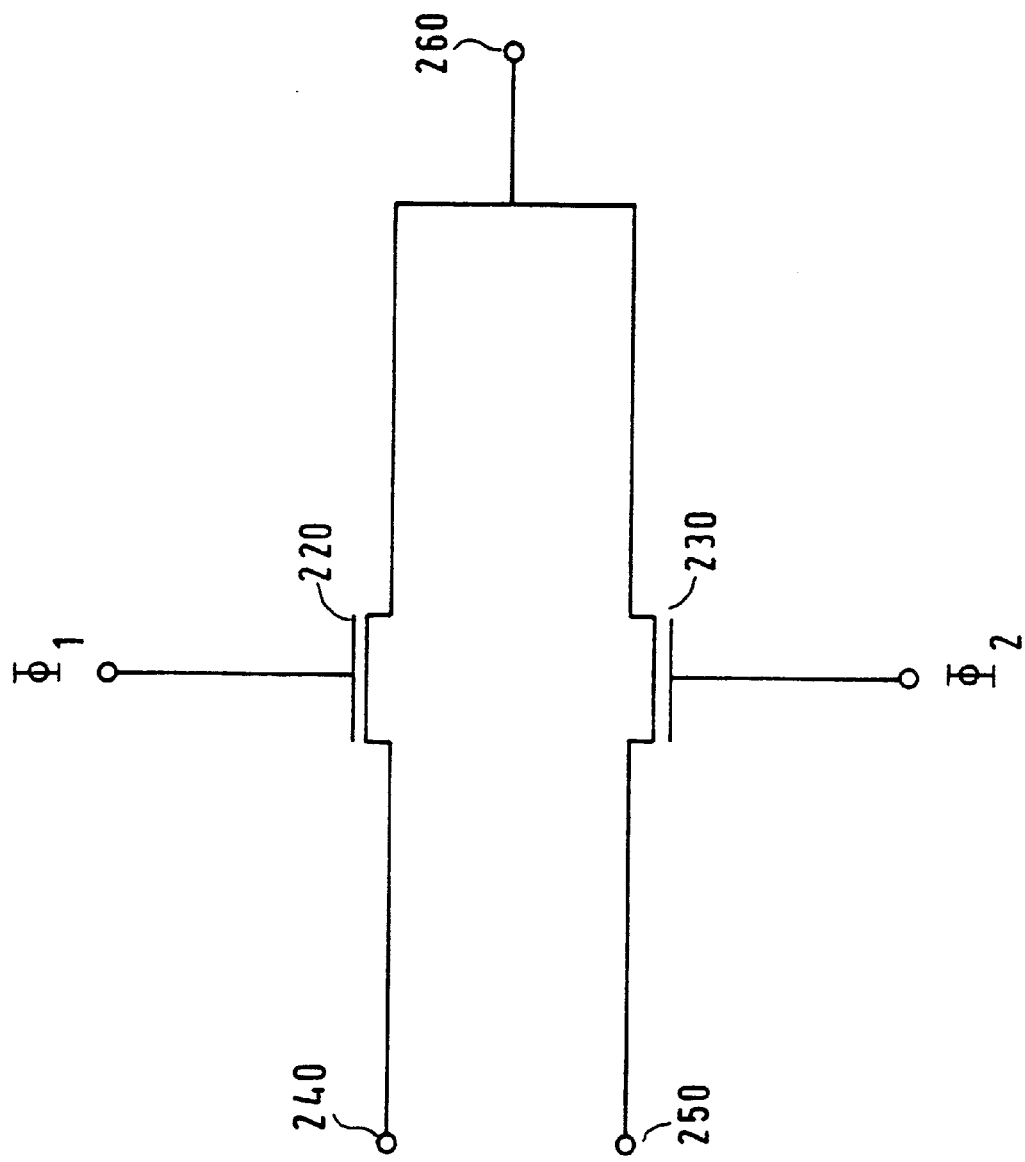

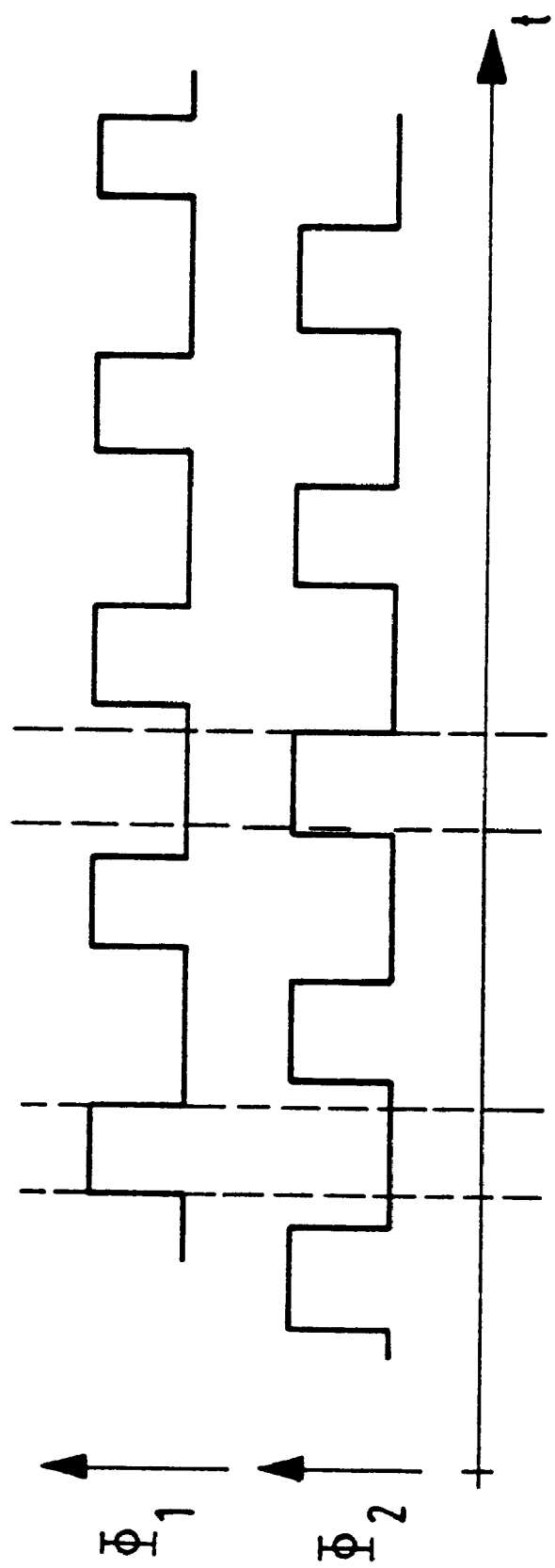

FILTER CIRCUIT AND AUDIO SIGNAL PROCESSOR PROVIDED THEREWITH

TECHNICAL FIELD

The invention relates to a filter circuit and to an audio signal processor provided therewith.

BACKGROUND OF THE INVENTION

With apparatus in the field of entertainment electronics, such as for example radio receivers, cassette recorders, CD players and the like, it is usual to provide in the audio signal path adjustable filter circuits through which the user can take influence on certain sound characteristics, such as for example treble boost and treble cut or bass emphasis and bass cut. The adjustment of suitable filter characteristics is made by the user by means of operating members provided therefor. The adjustable filter circuits, for purposes of influencing the audio signals in entertainment electronics equipment, are designed as a rule such that they permit in particular also a neutral setting in which they have as little influence as possible on the audio signals with respect to frequency and phase response. In case the user desires no emphasis or de-emphasis at all of certain frequency ranges of the audio signal, he will select this neutral setting of the respective filter circuit.

With respect to numerous apparatus to be associated with the field of entertainment electronics, such as with compact radio receivers used in motor vehicles, a trend can be observed for a long time to achieve a cost reduction in manufacture by putting together the entire electrical circuit of the receiver from as few highly integrated electronic components as possible.

FIG. 6 shows a block diagram of an exemplary audio receiver. Radio frequency signals delivered from a radio frequency antenna 10 are supplied to a radio frequency receiver, hereinafter referred to as "radio frequency processor" RFP. Radio frequency processor RFP comprises radio frequency pre-stages, tuners, intermediate frequency amplifiers and intermediate filters as well as demodulators. A low frequency signal constituting the useful signal of the station received is fed to an audio signal processor ASP. This low frequency signal does not only include the demodulated audio signal, but also auxiliary signals for stereo reception, ARI identification, RDS and so on.

The audio signal processor ASP in particular converts the low frequency signal delivered by radio frequency processor RFP into audio signals which are fed to an audio power processor APP. The audio power processor APP comprises in particular a power amplifier 12 amplifying the output signals delivered from audio signal processor ASP, to such an extent that these can be reproduced through loudspeakers 13. Furthermore, the audio power processor APP comprises a voltage regulating module 14 for power supply.

The audio signal processor ASP may be fed, via additional analog inputs, with other audio signals, for example from cassette recorders, CD players or the like.

The audio receiver described is controlled in its entirety by a microcontroller 15 which is provided with an operating unit 20 that is accessible to the user. The exchange of data between microcontroller 15 on the one hand and radio frequency processor RFP, audio signal processor ASP and audio power processor APP on the other hand takes place through a conventional I²C bus.

FIG. 7 shows a schematic block diagram of the audio signal processor ASP of the audio receiver shown in FIG. 6.

The audio signal processor ASP has a number of analog audio signal inputs 50a to 50j that are connected to corresponding input lines of an analog multiplexer 55. A stereo output signal of analog multiplexer 55 is fed via output lines 57a and 57b to a chain of series-connected blocks 60, 62, 64, 66, 68 acting as signal processing means.

The audio signals first enter a muting filter ("mute") 60, and then in succession a volume control with loudness filter 62, a second muting arrangement with soft muting property ("soft mute") 64, a bass control ("bass") 66 as well as a treble control 68 ("treble"). The stereo audio signals then are fed to a number of audio driver amplifiers 70, where they are conditioned to such an extent that they are suitable for controlling the power output stages in power amplifier 12 within audio power processor APP.

In this respect, each channel of the stereo signal is split to a first sub-channel for a first loudspeaker to be installed in the front of the passenger compartment and a second sub-channel for a second loudspeaker to be installed in the rear of the passenger compartment.

The audio signal processor ASP comprises furthermore a number of usual functional blocks 72 to 82 which are necessary for processing the stereo differential signal, the ARI signal etc. Finally, there is provided a pause circuit 90 and a power supply means 95.

It is apparent that the integrated audio signal processor ASP represented in FIGS. 6 and 7 does not constitute the sole possible embodiment of such a processor. In particular, the audio signal processor may also be implemented without the functional units for processing FM stereo signals. The type and the number of the LF stages for taking influence on the audio signal may also vary for each particular case.

The circuit described hereinbefore involves the disadvantage that there is no complete integration of the audio filters 62, 66, 68 since numerous RC members with high resistances and/or capacitances are realized by means of external components because of a too large space requirement of the resistors R and capacitors C, respectively.

The document GB-A-2,138,231 discloses a signal transmission circuit with MOS switches. This circuit comprises capacitors that are switchable by said MOS switches, as well as an operational amplifier. Switching of the MOS switches takes place under the control of the output signal of a voltage-controlled oscillator whose output frequency can be varied by means of a variable voltage source, whereby the transmission characteristics of the known signal transmission circuit is adjustable. In another circuit, also known from said document GB-A-2,138,231, the feedback path of the operational amplifier has disposed therein a parallel connection including a feedback resistor and an SC filter. In a first mode of operation, the SC filter is located in the feedback loop, whereas in a second operational state it is not active in the feedback loop.

The document U.S. Pat. No. 4,453,143 discloses an equalizer having a filter and a summing amplifier. Both the summing amplifier and the filter contain switched capacitors. The summing amplifier has an operational amplifier having, however, no filters at all provided in its feedback loop.

SUMMARY OF THE INVENTION

The publication in the book by Hans Eigler: "Mikroelektronische Filter", Berlin: Publisher Technik GmbH, 1st edition 1990, pages 72 to 83, reveals the principles of SC filters.

It is thus an object of the invention to make available a filer circuit as well as audio signal processor provided therewith, which do not involve the prior art disadvantages and which in particular can easily be integrated completely.

This object is met according to the invention by a filer circuit having the features indicated in claim 1. It is met furthermore by an audio signal processor according to the features indicated in patent claim 9. Further improvements of the subject matters of these patent claims are set out in the dependent claims.

BRIEF DESCRIPTION OF THE DRAWINGS

FIG. 2a is a schematic view of a resistor member 200 designed as switched capacitor.

FIG. 2b is an equivalent circuit diagram of the resistor member 200 shown in FIG. 2a.

FIG. 2c shows an exemplary implementation of a switching means of FIG. 2b utilizing two MOS-transistors.

FIG. 2d shows clock signals which are free from overlapping.

DETAILED DESCRIPTION OF THE INVENTION

Figure 1:
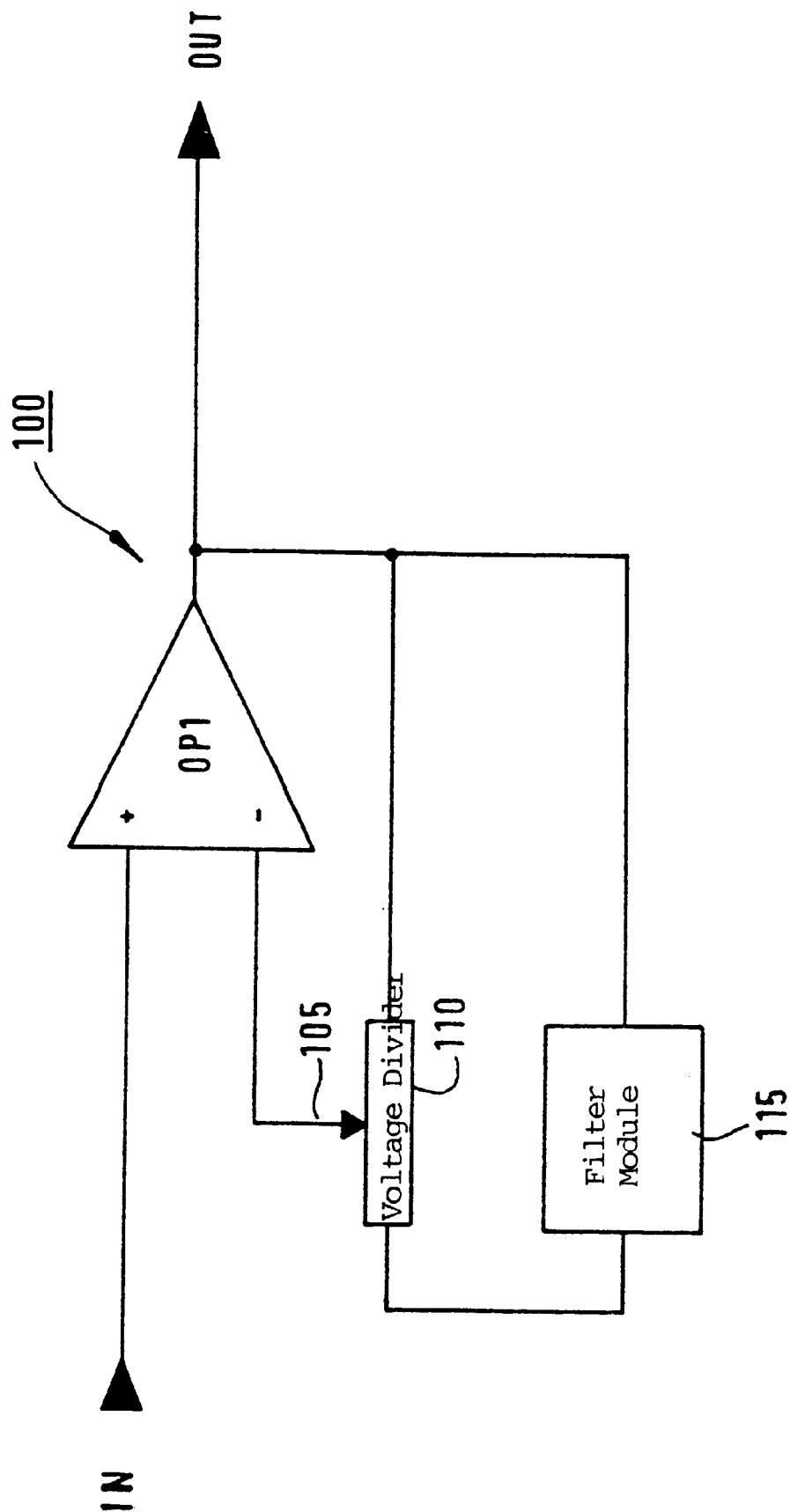
FIG. 1 shows a block diagram of an adjustable audio filter according to the invention, which is designed in SC technology.
Figure 7:
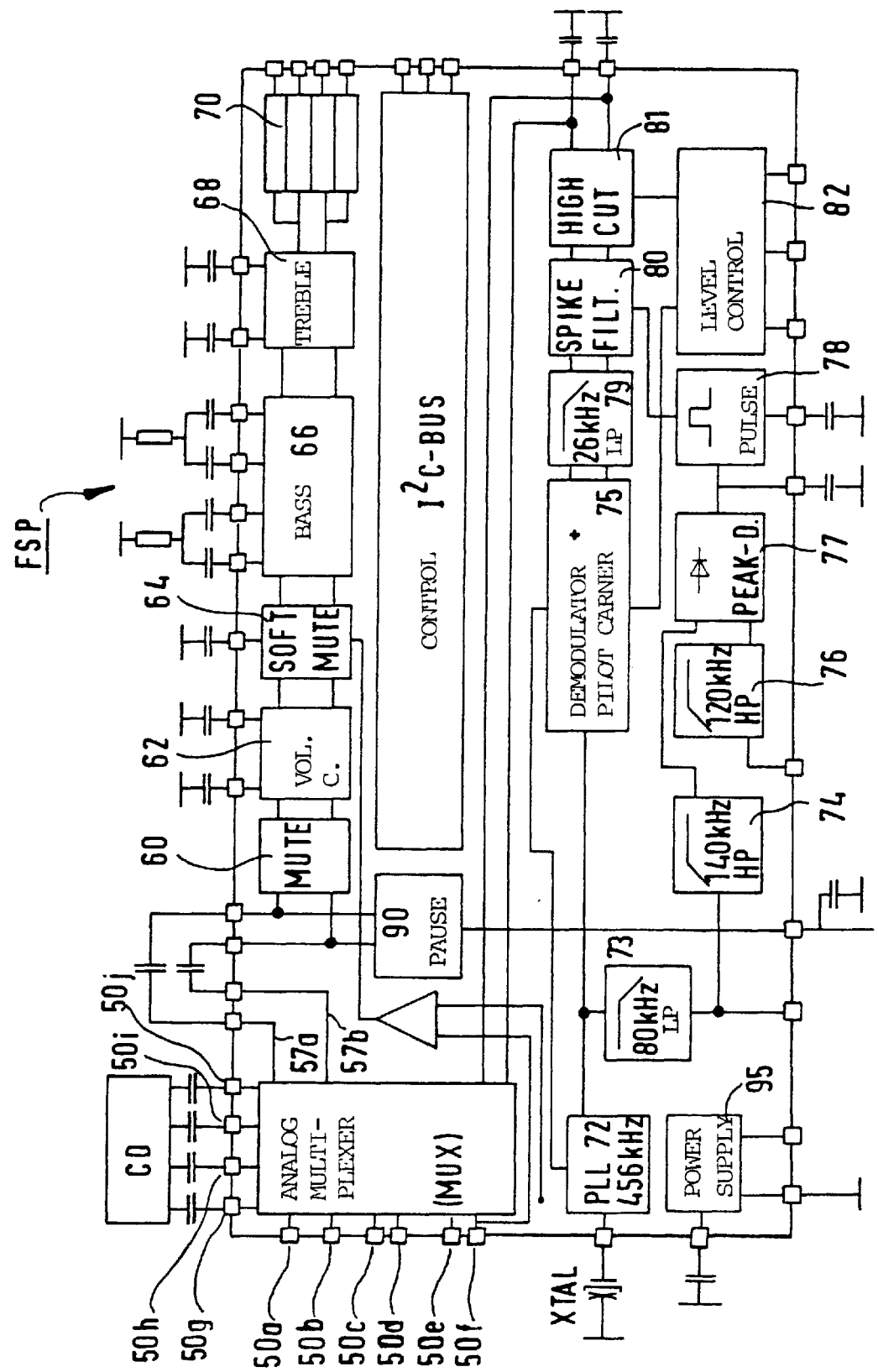
FIG. 7 shows a schematic block diagram of the audio signal processor of the audio receiver of FIG. 6 with some peripheral circuitry.

FIG. 1 shows a block diagram of an adjustable switched capacitor (SC) technology audio filter 100 according to the invention, which is suitable in particular for use in an audio signal processor ASP as shown for example in FIG. 7.

The audio filter 100 shown in FIG. 1 then is suitable in particular for implementation of the loudness filter 62, the bass filter 66 and of the treble filter 68.

The audio filter comprises an operational amplifier OP having a non-inverting input connected to an input IN and an output connected to an output OUT. The operational amplifier OP1 also has an inverting input connected to a tap 105 of an ohmic voltage divider 110 connected between the output of operational amplifier OP1 and an output of a filter module 115 realized in SC technology. An input of filter module 115 is connected to the output of operational amplifier OP1.

The setting of the tap 105 of ohmic voltage divider 110 determines the effectiveness of the audio filter 100 shown in FIG. 1. When the tap 105 of ohmic voltage divider 110 is set such that it is directly short-circuited with the output of operational amplifier OP1, the circuit shown in FIG. 1 behaves like a voltage follower with a unity amplification factor. The filter module 115 is not located in the signal path. In this case, the filter is in its neutral setting, and filter module 115 feeds no noise voltages into the audio output signal at output terminal OUT, nor does it cause signal distortions.

In the extent in which the tap 105 of the ohmic voltage divider 110 is changed in its setting such that a partial resistance between the output of operational amplifier OP1 and tap 105 becomes effective, the filter module 115 enters into the signal path and takes influence on the frequency characteristics of the filter. As such, the ohmic voltage divider 110 acts as. a filter control unit that controls whether the filter module 115 operates on the audio signal received at the input IN.

The output signal at the output terminal of operational amplifier OP1 is subjected to a negative feedback, via filter module 115 and voltage divider 110, to the inverting input of operational amplifier OP1.

The ohmic voltage divider 110 may be designed as a conventional potentiometer. However, when used in an integrated circuit, it is advantageous to design ohmic voltage divider 110 for example as a resistor chain switched by MOS switches. When the filter circuit according to FIG. 1 is used in an audio signal processor ASP (as shown in FIG. 7, for example), it is possible to adjust the ohmic voltage divider 110 by a digital setting means, e.g., via the $1^2C$ bus.

Figure 3:
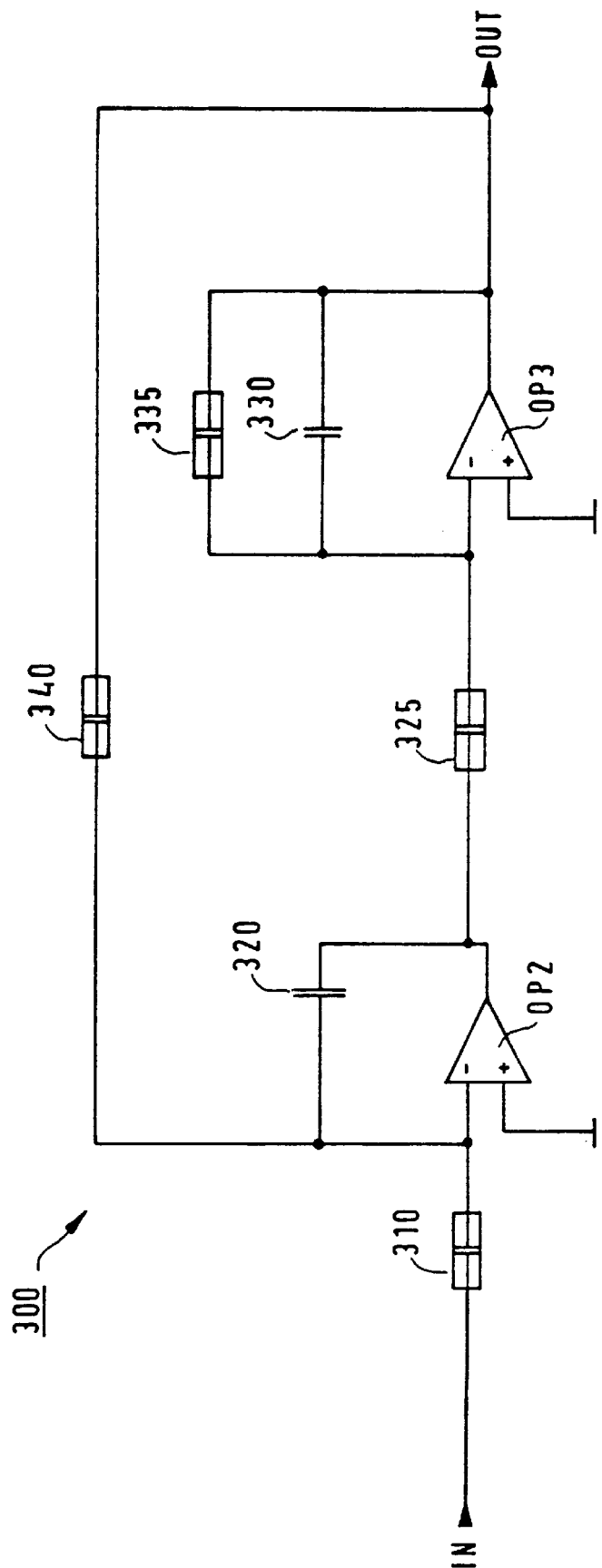
FIG. 3 shows a circuit diagram of a first embodiment of the SC filter module of FIG. 1, namely for a loudness filter.
Figure 4:
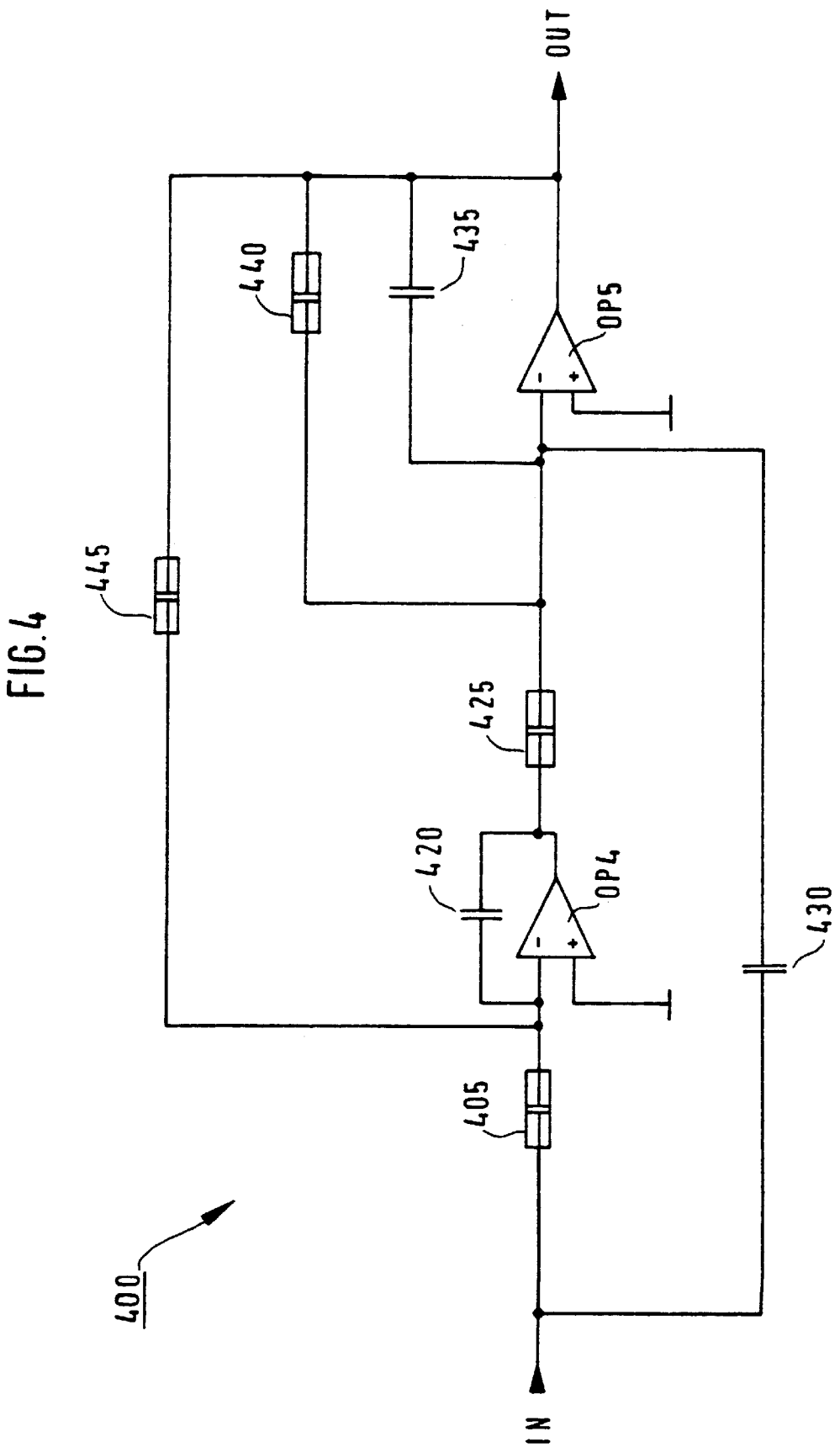
FIG. 4 shows a circuit diagram of a second embodiment of the SC filter of FIG. 1, namely for a bass filter.
Figure 5:
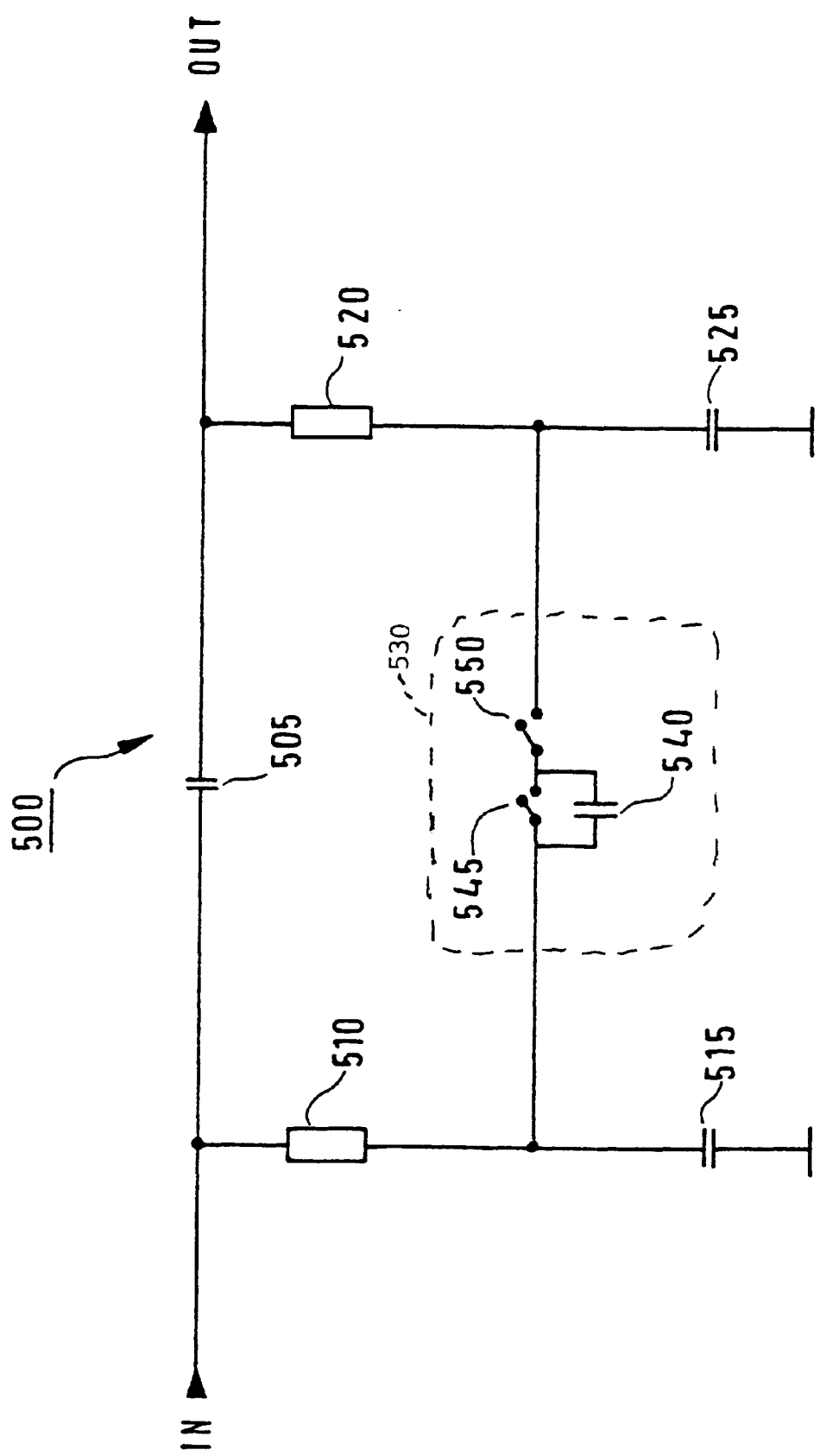
FIG. 5 shows a circuit diagram of a third embodiment of the SC filter module of FIG. 1, namely for a treble filter.
Figure 6:
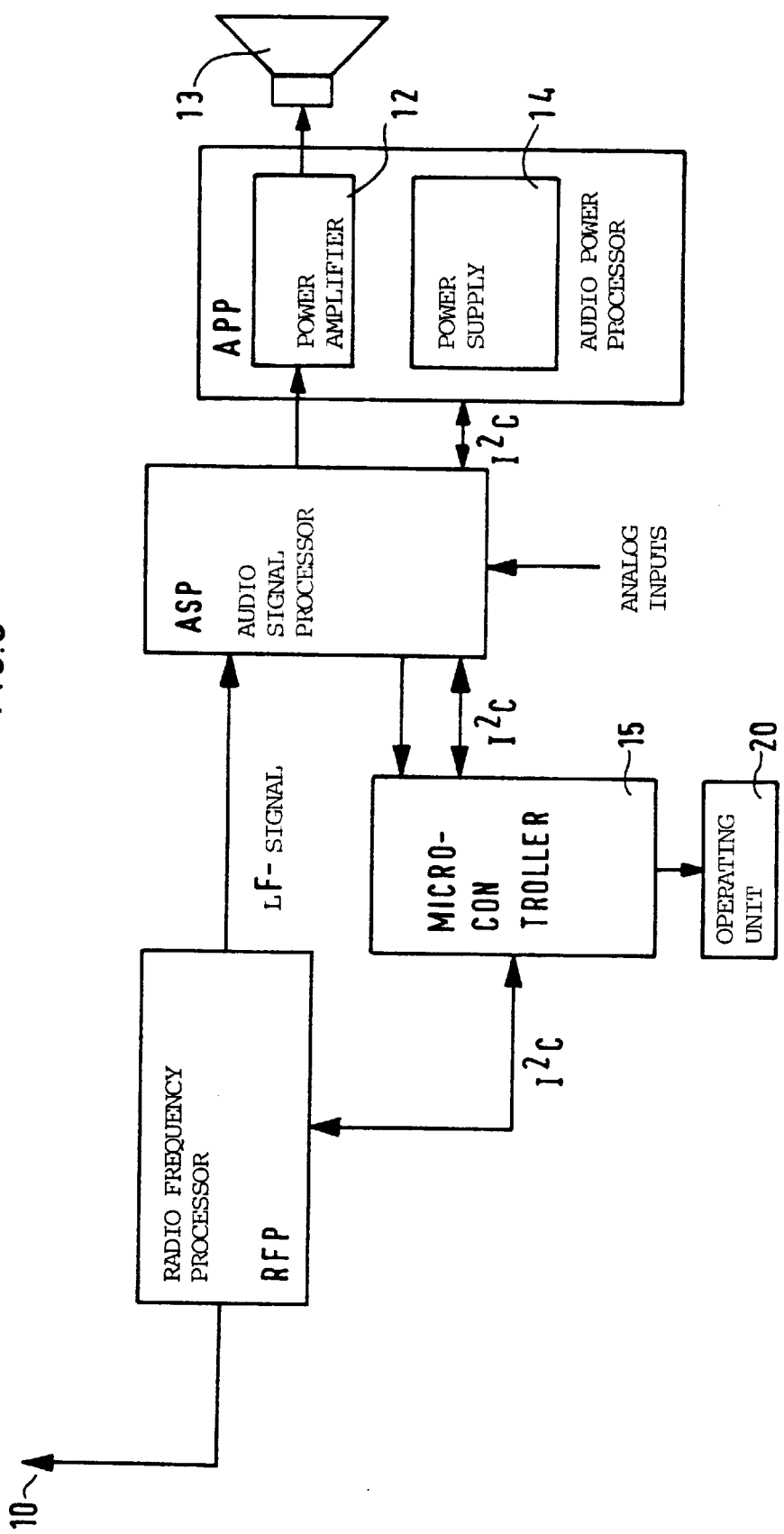
FIG. 6 shows a schematic block diagram of an exemplary audio receiver.

FIG. 2a shows a schematic representation of a resistor member 200 implemented with a switched capacitor, as employed in the embodiments shown in FIGS. 3 to 5.

FIG. 2b shows an electrical equivalent circuit diagram of the resistor member 200 shown in FIG. 2a. Input IN of the circuit may be connected via a first switch SI to a first terminal of a capacitor 210, or may be connected to ground. Output terminal OUT may be connected via a second switch S2 to a second terminal of capacitor 210, or may be connected to ground. When the switches S1, S2 are not addressed, they are in an electrically open state.

FIG. 2c shows an exemplary implementation of the switches S1, S2 of FIG. 2b using two MOS transistors 220, 230. A first MOS transistor 220 connects, via its source-drain path, a common terminal 260 to a first switch output terminal 240, whereas a second MOS transistor 230 connects, via its source-drain path, the common terminal 260 to a second switch output terminal 250. The gate of first MOS transistor 220 is connected to the clock signal $\Phi_1$, whereas the gate of the second MOS transistor 230 is connected to clock signal $\Phi_2$. FIG. 2d shows clock signals $\Phi_1$, $\Phi_2$ for controlling the switches S1, S2 in FIG. 2b and the MOS transistors 220, 230 in FIG. 2c, respectively. As is usual in SC technology, the two clock signals $101_1$, $\Phi_2$ are designed such that their high-level (active) intervals do not overlap at any time. The effect achieved thereby is that in the circuit according to FIG. 2c there is always only a single one of the two MOS transistors 220, 230 conducting and the common terminal 260 thus is open or is connected either to first switch terminal 240 or to second switch terminal 250, but never to both simultaneously.

FIG. 3 shows an electronic circuit diagram of a first embodiment 300 of a filter module 115, namely for a loudness filter. The circuit embodies a low pass of the second order and is designed in SC technology.

An input terminal IN is connected to the inverting input of an operational amplifier OP2 via a first resistor 310 designed in SC technology. The non-inverting input of operational amplifier OP2 is connected to ground.

The output of operational amplifier OP2 is connected via a capacitor 320 to the inverting input thereof. The inverting input of a further operational amplifier OP3 is connected via a second resistor 325 designed in SC technology to the output of operational amplifier OP2. The non-inverting input of operational amplifier OP3 is also connected to ground.

The output of operational amplifier OP3 is connected via a third capacitor 330 to the inverting input thereof Connected in parallel to third capacitor 330 is a third resistor 335 in SC technology. A fourth resistor 340 in SC technology connects the inverting input of operational amplifier OP2 to the output of operational amplifier OP3.

The output of operational amplifier OP3 is connected to an output OUT.

FIG. 4 shows an electric circuit diagram of a second embodiment 400 of a filter module 115. The circuit shown in FIG. 4 is employed in a bass filter.

The inverting input of an operational amplifier OP4 is connected to an input IN via a first resistor 405 in SC technology. The output of operational amplifier OP4 is connected via a first filter capacitor 420 to its inverting input. The inverting input of an additional operational amplifier OP5 is connected via a second resistor 425 in SC technology to the output of operational amplifier OP4. The inverting input of operational amplifier OP5 is connected furthermore via a second filter capacitor 430 to input IN and via a third filter capacitor 435 to the output thereof Finally, inverting input of operational amplifier OP5 is connected via a third resistor 440 in SC technology to the output thereof The output of operational amplifier OP5 is connected via a fourth resistor 445 in SC technology to the inverting input of operational amplifier OP4.

The terminal of the third resistor 440 in SC technology that is not connected to the inverting input of operational amplifier OP5 as well as the terminal of the third filter capacitor 435 that is not connected to the inverting input of operational amplifier OP5, are connected to each other. The output of operational amplifier OP5 is connected to output terminal OUT. The non-inverting inputs of operational amplifiers OP4 and OP5, respectively, are each connected to reference potential (ground).

FIG. 5 shows an electrical circuit diagram of a third embodiment 500 of a filter module 115, namely for a treble filter.

An input IN is connected via a first capacitor 505 to an output OUT. Moreover, input IN is connected via a first resistor 510 and a second capacitor 515 to ground. The output terminal OUT is also connected to ground via a second resistor 520 and a third capacitor 525. The coupling points between resistor 510 and capacitor 515 as well as resistor 520 and capacitor 525 are connected to each other via a resistor 530 in SC technology. The SC resistor 530 includes a capacitor 540 connected in parallel with a first switch 545 and in series with a second switch 550.

It should be understood that even though numerous features and advantages of the present invention have been set forth in the foregoing description, the above disclosure is illustrative only. Changes may be made in detail and yet remain within the broad principles of the present invention.

What is claimed is:

1. A filter circuit for adjustably decreasing or increasing the amplitude of audio signals in a predetermined frequency range, comprising
   an input and an output;
   a first operational amplifier with an inverting input, a non-inverting input, and an output, the non-inverting input being connected to said input;
   an ohmic voltage divider having a tap connected to the inverting input of first operational amplifier and a first end terminal connected to the output of first operational amplifier; and
   a filter module having an RC network with at least one frequency-response-determining RC member with a resistor component R is realized in SC technology, the filter module including an input connected to the output of first operational amplifier and an output connected to a second end terminal of ohmic voltage divider.

2. The filter circuit of claim 1 wherein the voltage divider comprises a potentiometer.

3. The filter circuit of claim 1 wherein the voltage divider includes one or more transistors.

4. The filter circuit of claim 1 wherein the filter module comprises a biquad filter.

5. The filter circuit of claim 4 wherein the filter module comprises:
   a) a second operational amplifier with an inverting input, a non-inverting input, and an output;
   b) a third operational amplifier with an inverting input, a non-inverting input, and an output;
   c) a first SC resistor member;
   d) a second SC resistor member;
   e) a third SC resistor member;
   f) a fourth SC resistor member;
   g) a first filter capacitor;
   h) a second filter capacitor; and
   i) a third filter capacitor;
   j) the non-inverting input of the second operational amplifier and the non-inverting input of the third operational amplifier being at a reference potential;
   k) the input of the filter module being connected via the first SC resistor member to the inverting input of the second operational amplifier;
   l) the output of the filter module being connected to the output of the third operational amplifier;
   m) the inverting input of the third operational amplifier being connected via the second filter capacitor to the input of the filter module;
   n) the output of the second operational amplifier being connected via the first filter capacitor to the inverting input of the second operational amplifier;
   o) the output of the second operational amplifier being connected via the second SC resistor member to the inverting input of the third operational amplifier;
   p) the inverting input of the third operational amplifier being connected via the third SC resistor member to the output of the third operational amplifier;
   q) the inverting input of the second operational amplifier being connected via the fourth SC resistor member to the output of the third operational amplifier; and
   r) the inverting input of the third operational amplifier being connected via the third filter capacitor to the output of the third operational amplifier.

6. The filter circuit of claim 1 wherein the filter module comprises:
   a) first, second, and third capacitors;
   b) first and second resistors;
   c) an SC resistor member;
   d) the input of the filter module being connected via the first capacitor to the output of the filter module;
   e) the input of the filter module being connected via the first resistor and the second capacitor to a reference potential;
   f) the output of the filter module being connected via the second resistor and the third capacitor to the reference potential; and
   g) the circuit node between the first resistor and the second capacitor being connected via the SC resistor member to a circuit node between the second resistor and the third capacitor.

7. The filter circuit of claim 6 wherein the SC resistor member comprises a switched capacitor, a first switching means and a second switching means, the first switching means, in a conducting state, discharging the switched capacitor, and the second switching means, in a non-conducting state, electrically separating a terminal of the switched capacitor from the surroundings.

8. The filter circuit of claim 1 wherein the filter module comprises:
   a) a second operational amplifier with an inverting input, a non-inverting input, and an output;
   b) a third operational amplifier with an inverting input, a non-inverting input, and an output;
   c) a first SC resistor member;
   d) a second SC resistor member;
   e) a third SC resistor member;
   f) a fourth SC resistor member;
   g) a first filter capacitor; and
   h) a second filter capacitor;
   i) the non-inverting input of the second operational amplifier and the noninverting input of the third operational amplifier being at a reference potential;
   j) the input of the filter module being connected via the first SC resistor member to the inverting input of the second operational amplifier;
   k) the output of the second operational amplifier being connected via the second SC resistor member to the inverting input of the third operational amplifier;
   l) the output of the third operational amplifier being connected to the output of the filter module;
   m) the output of the second operational amplifier being connected via the first filter capacitor to the inverting input of the second operational amplifier;
   n) the output of the third operational amplifier being connected via the second filter capacitor to the inverting input of the third operational amplifier;
   o) the output of the third operational amplifier being connected via the third SC resistor member to the inverting input of the third operational amplifier; and
   p) the output of the third operational amplifier being connected via the fourth SC resistor member to the inverting input of the second operational amplifier.

9. An audio signal processor, comprising:
   a) an audio signal input, an audio signal output, and a control input; and
   b) an audio signal processing unit connected between the audio signal input and the audio signal output, characterized in that c) the audio signal processing unit comprises at least one filter circuit according to claim 1.

10. The audio signal processor of claim 9, further comprising:
    a digital control unit connected to a data bus line, the digital control unit determining the setting of the voltage divider.

11. An audio receiver, comprising:
    an audio signal input node for receiving an input audio signal;
    an audio signal output node for outputting an output audio signal;
    an audio signal processor connected between the input node and the output node, the audio signal processor receiving the input audio signal and producing the output audio signal, the audio signal processor including:
    a first operational amplifier connected between the input node and the output node, the first operational amplifier having a first input that receives the input audio signal, a second input, and an output at which the output audio signal is output;
    a filter module having an RC network with a switched capacitor RC member, the RC network determining a frequency response of the filter module, the filter module being connected in a feedback loop between the second input and the output of the first operational amplifier; and
    a filter control unit that selectively enables and disables the filter module, the filter control unit preventing the filter module from causing signal distortions in the output audio signal when the filter control unit disables the filter module.

12. The audio receiver of claim 11 wherein the filter control unit includes a voltage divider having a control tap connected to the second input of the first operational amplifier, a first end terminal connected to the filter module, and a second end terminal connected to the output of the first operational amplifier.

13. The audio receiver of claim 12 wherein the voltage divider includes a potentiometer.

14. The audio receiver of claim 11 wherein the filter module includes a biquad filter.

15. The audio receiver of claim 11 wherein the switched capacitor RC member includes:
    an input and an output;
    a first switch connected to the input and having first and second positions;
    a second switch connected to the output and having first and second positions; and
    a capacitor having first and second plates, wherein when the first and second switches are in their first positions, the first switch connects the first plate to the input and the second switch connects the second plate to the output, and when the first and second switches are in their second positions, the first switch connects the input to a reference potential, the second switch connects the output to the reference potential, and the capacitor is disconnected from the input and output.

16. The audio receiver of claim 11 wherein the filter module includes:
    a second operational amplifier with an inverting input, a non-inverting input, and an output, the non-inverting input being at a reference potential;
    a third operational amplifier with an inverting input, a non-inverting input, and an output, the non-inverting input being at a reference potential and the output being connected to the filter control unit;
    a first SC resistor member connecting the inverting input of the second operational amplifier to the output of the first operational amplifier;
    a first filter capacitor connected between the output and the inverting input of the second operational amplifier;
    a second SC resistor member connecting the output of the second operational amplifier to the inverting input of the third operational amplifier;

a third SC resistor member connected between the output and the inverting input of the third operational amplifier;

a second filter capacitor connected between the output and the inverting input of the third operational amplifier;

a fourth SC resistor member connecting the output of the third operational amplifier to the inverting input of the second operational amplifier.

17. The audio receiver of claim 16 wherein the filter module further comprises a third filter capacitor connecting the inverting input of the third operational amplifier to the output of the first operational amplifier.

18. The audio receiver of claim 11 wherein the filter module includes:

a first capacitor connected between the second input and the output of the first operational amplifier;

a second capacitor having a first plate and a second plate, the second plate being connected to a reference potential;

a third capacitor having a first plate and a second plate, the second plate being connected to a reference potential;

a first resistor connecting the first plate of the second capacitor to the output of the first operational amplifier;

a second resistor connecting the first plate of the third capacitor to the second input of the first operational amplifier; and an SC resistor member connecting the first plate of the second capacitor with the first plate of the third capacitor.

19. The audio receiver of claim 18 wherein the SC resistor member includes:

a fourth capacitor;

a first switch connected in parallel to the fourth capacitor and discharging the fourth capacitor when the first switch is closed;

a second switch connected in series with the first switch and the fourth capacitor, wherein when the second switch is closed, the fourth capacitor is connected between the first plate of the second capacitor and the first plate of the third capacitor.

20. The audio receiver of claim 11, further comprising:

a digital control unit coupled to the filter control unit, the digital control unit causing the filter control unit to disable the filter module in response to user input.

* * * * *